(12) United States Patent
Takeuchi et al.

(10) Patent No.: US 10,714,611 B2
(45) Date of Patent: Jul. 14, 2020

(54) SILICON CARBIDE SEMICONDUCTOR DEVICE

(71) Applicants: DENSO CORPORATION, Kariya, Aichi-pref. (JP); TOYOTA JIDOSHA KABUSHIKI KAISHA, Toyota-shi, Aichi-ken (JP)

(72) Inventors: Yuichi Takeuchi, Kariya (JP); Atsuya Akiba, Kariya (JP); Sachiko Aoi, Nagakute (JP); Katsumi Suzuki, Nagakute (JP)

(73) Assignees: DENSO CORPORATION, Kariya (JP); TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 16/505,760

(22) Filed: Jul. 9, 2019

(65) Prior Publication Data
US 2019/0334030 A1    Oct. 31, 2019

Related U.S. Application Data

(63) Continuation of application No. PCT/JP2018/001262, filed on Jan. 17, 2018.

(30) Foreign Application Priority Data

Jan. 17, 2017 (JP) .................... 2017-006003

(51) Int. Cl.
*H01L 29/06* (2006.01)
*H01L 29/16* (2006.01)
(Continued)

(52) U.S. Cl.
CPC ...... *H01L 29/7813* (2013.01); *H01L 21/0243* (2013.01); *H01L 21/02378* (2013.01);
(Continued)

(58) Field of Classification Search
CPC ........... H01L 21/0243; H01L 21/02609; H01L 29/045; H01L 29/0661; H01L 29/1608;
(Continued)

(56) References Cited

U.S. PATENT DOCUMENTS

2009/0200559 A1    8/2009  Suzuki et al.
2009/0261350 A1*  10/2009  Yamamoto .......... H01L 29/0623
                                                              257/77
(Continued)

*Primary Examiner* — Yu Chen
(74) *Attorney, Agent, or Firm* — Posz Law Group, PLC

(57) ABSTRACT

A silicon carbide semiconductor device includes: a vertical semiconductor element, which includes: a semiconductor substrate made of silicon carbide and having a high impurity concentration layer on a back side and a drift layer on a front side; a base region made of silicon carbide on the drift layer; a source region arranged on the base region and made of silicon carbide; a deep layer disposed deeper than the base region; a trench gate structure including a gate insulation film arranged on an inner wall of a gate trench which is arranged deeper than the base region and shallower than the deep layer, and a gate electrode disposed on the gate insulation film; a source electrode electrically connected to the base region, the source region, and the deep layer; and a drain electrode electrically connected to the high impurity concentration layer.

9 Claims, 10 Drawing Sheets

(51) Int. Cl.
  *H01L 29/78* (2006.01)
  *H01L 29/423* (2006.01)
  *H01L 29/66* (2006.01)
  *H01L 29/10* (2006.01)
  *H01L 21/02* (2006.01)
  *H01L 21/04* (2006.01)
  *H01L 29/04* (2006.01)
  *H01L 29/739* (2006.01)

(52) U.S. Cl.
  CPC .. *H01L 21/02529* (2013.01); *H01L 21/02609* (2013.01); *H01L 21/049* (2013.01); *H01L 21/0465* (2013.01); *H01L 21/0475* (2013.01); *H01L 29/063* (2013.01); *H01L 29/0619* (2013.01); *H01L 29/0696* (2013.01); *H01L 29/105* (2013.01); *H01L 29/1079* (2013.01); *H01L 29/1095* (2013.01); *H01L 29/1608* (2013.01); *H01L 29/4236* (2013.01); *H01L 29/66068* (2013.01); *H01L 29/7811* (2013.01); *H01L 21/02634* (2013.01); *H01L 29/045* (2013.01); *H01L 29/7397* (2013.01)

(58) Field of Classification Search
  CPC ........... H01L 29/7813; H01L 29/66734; H01L 29/7397; H01L 29/66348; H01L 29/66068; H01L 29/4236; H01L 29/1095; H01L 29/0619; H01L 29/063; H01L 29/7811; H01L 29/0623; H01L 29/105; H01L 29/0696
  See application file for complete search history.

(56) References Cited

U.S. PATENT DOCUMENTS

| | | | |
|---|---|---|---|
| 2009/0311839 A1* | 12/2009 | Miyahara | H01L 21/26513 438/270 |
| 2013/0306983 A1* | 11/2013 | Nakano | H01L 29/0623 257/76 |
| 2014/0014972 A1* | 1/2014 | Nakano | H01L 29/045 257/77 |
| 2014/0145212 A1* | 5/2014 | Takeuchi | H01L 29/66068 257/77 |
| 2015/0115286 A1* | 4/2015 | Takeuchi | H01L 21/8213 257/77 |
| 2015/0129895 A1* | 5/2015 | Takeuchi | H01L 29/4236 257/77 |
| 2016/0104794 A1* | 4/2016 | Takeuchi | H01L 29/1608 257/77 |
| 2017/0012108 A1* | 1/2017 | Sakakibara | H01L 21/2033 |
| 2017/0012109 A1 | 1/2017 | Akagi et al. | |
| 2018/0069115 A1* | 3/2018 | Sugai | H01L 21/26513 |
| 2018/0097069 A1* | 4/2018 | Utsumi | H01L 29/1095 |
| 2018/0175138 A1* | 6/2018 | Ueno | H01L 29/7813 |
| 2019/0019680 A1* | 1/2019 | Takeuchi | H01L 29/1095 |
| 2019/0035882 A1* | 1/2019 | Takeuchi | H01L 29/66068 |
| 2019/0035883 A1* | 1/2019 | Takeuchi | H01L 29/872 |
| 2019/0058060 A1* | 2/2019 | Saito | H01L 29/0865 |
| 2019/0058061 A1* | 2/2019 | Saito | H01L 29/0696 |

\* cited by examiner

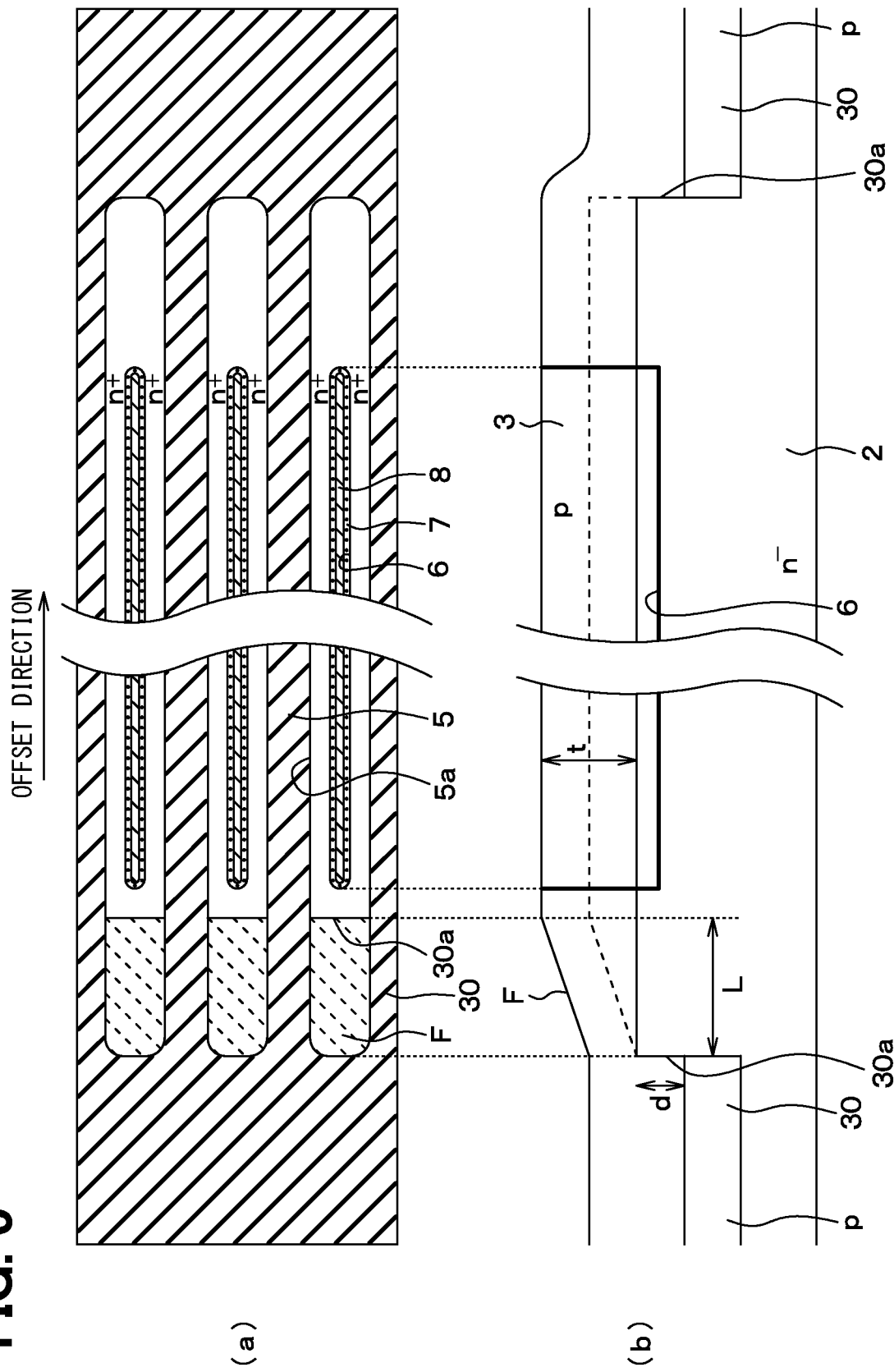

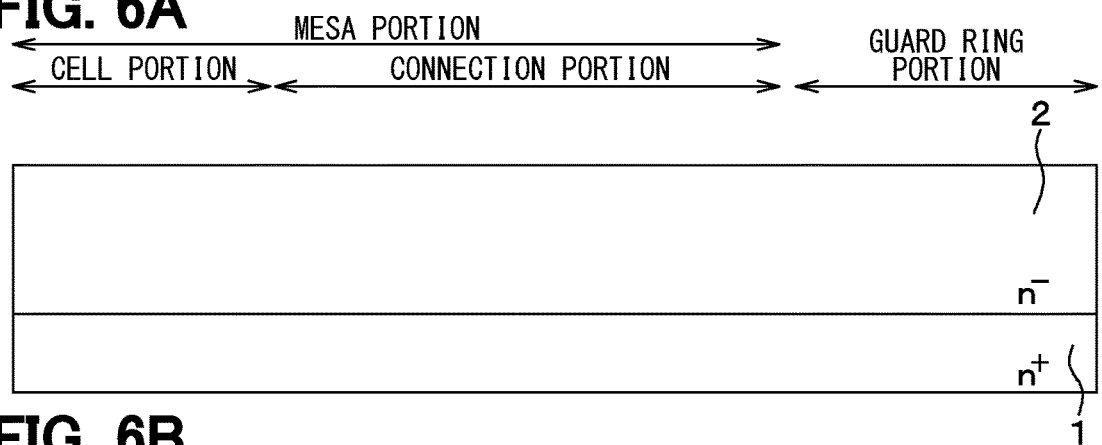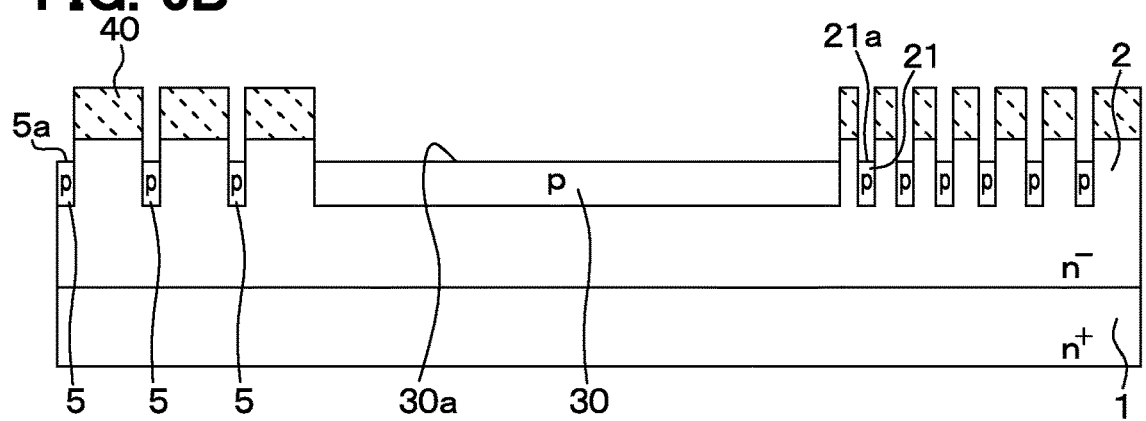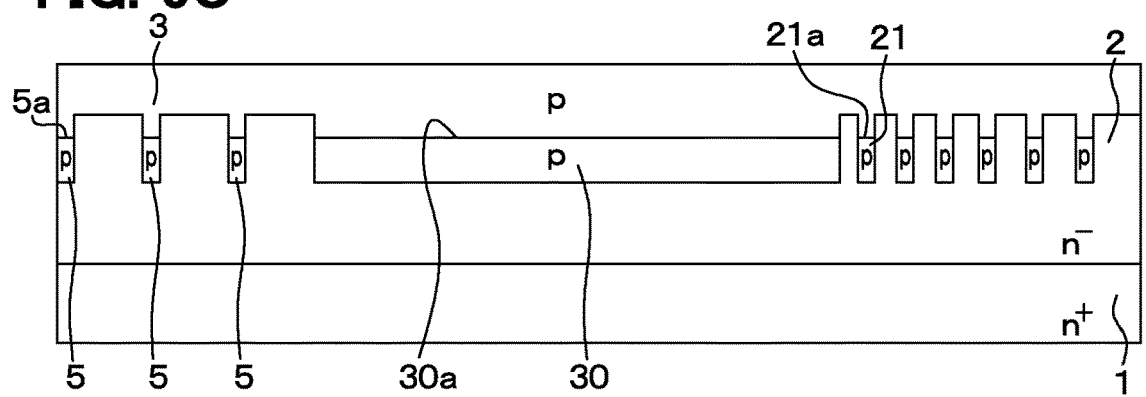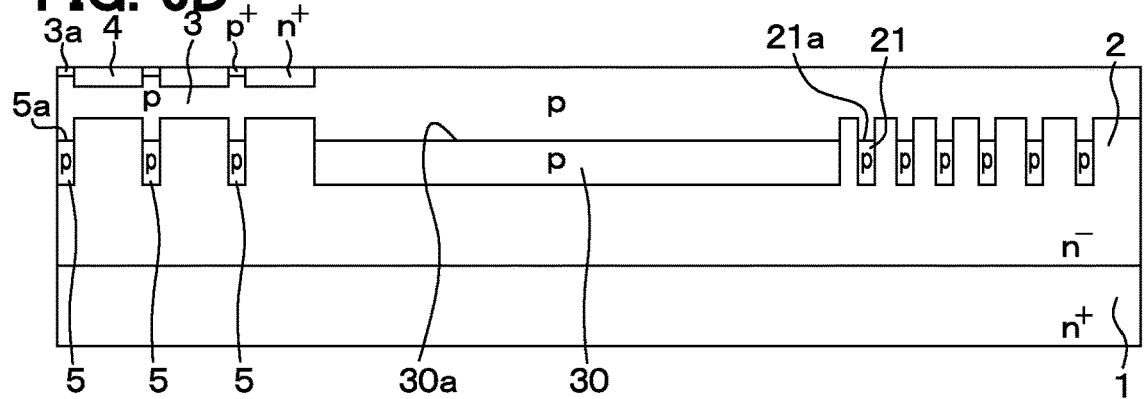

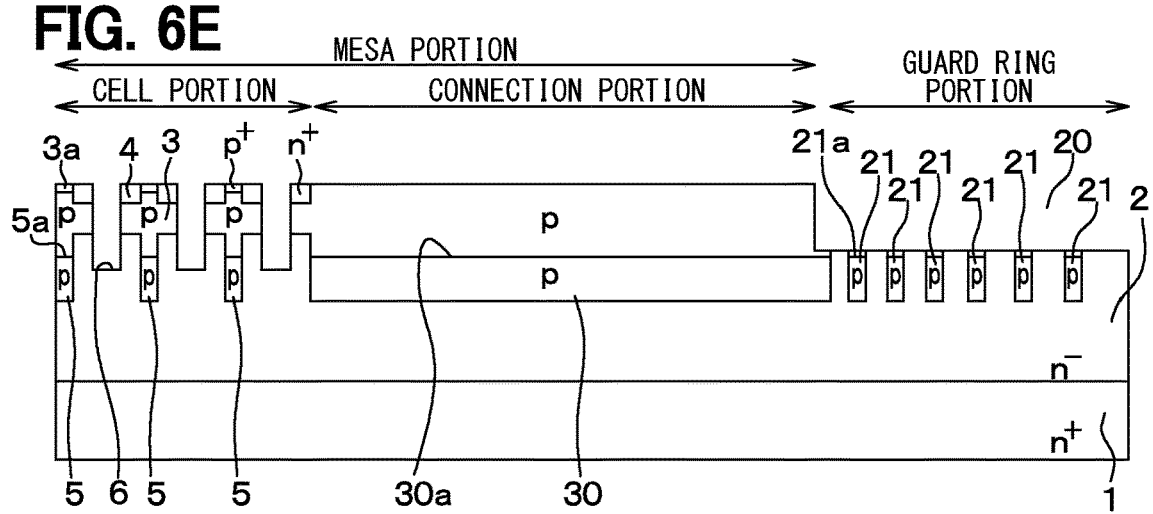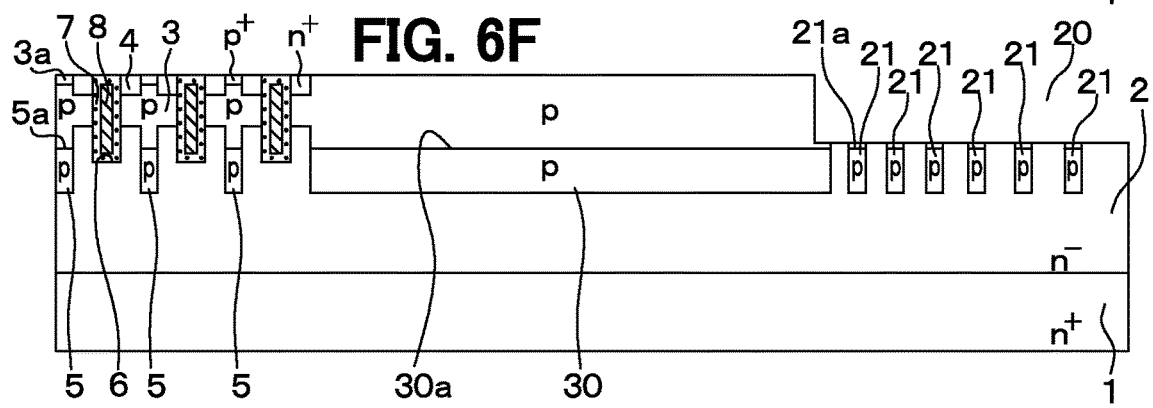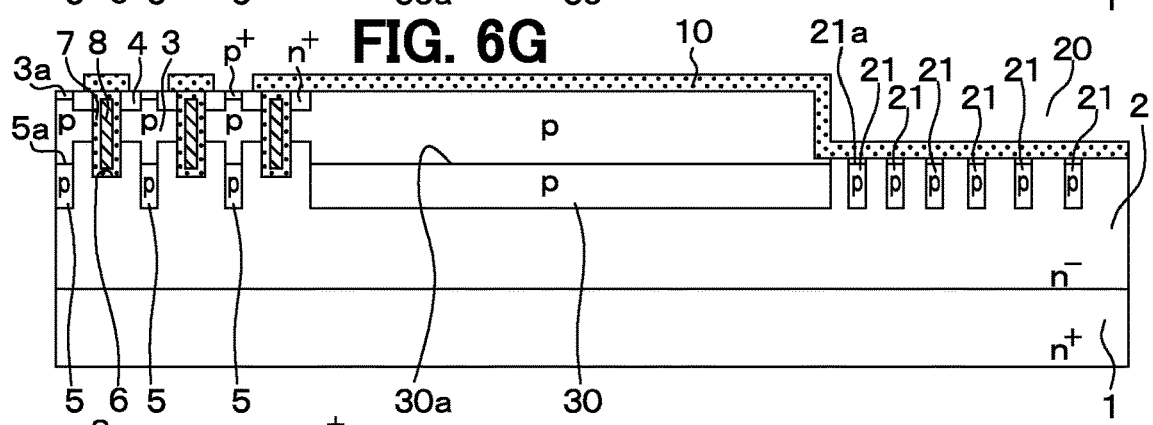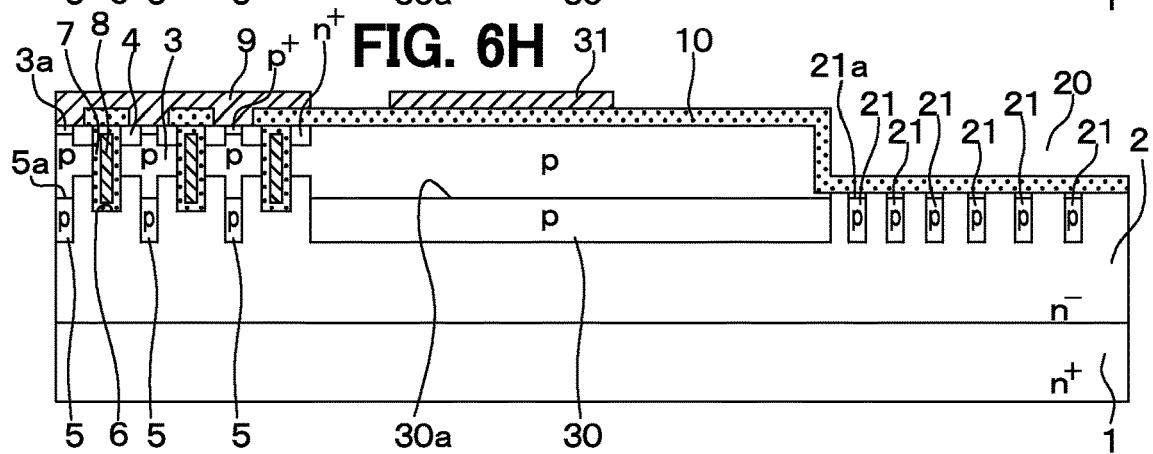

US 10,714,611 B2

SILICON CARBIDE SEMICONDUCTOR DEVICE

CROSS REFERENCE TO RELATED APPLICATION

The present application is a continuation application of International Patent Application No. PCT/JP2018/001262 filed on Jan. 17, 2018, which designated the U.S. and claims the benefit of priority from Japanese Patent Application No. 2017-6003 filed on Jan. 17, 2017. The entire disclosures of all of the above applications are incorporated herein by reference.

TECHNICAL FIELD

The present disclosure relates to a silicon carbide (hereinafter referred to as SiC) semiconductor device with a trench gate structure having a deep layer.

BACKGROUND

In a SiC semiconductor device providing a high breakdown electric field strength, a high electric field is generated due to the high breakdown electric field strength, and when forming an element having the trench gate structure, the high electric field is generated particularly at the bottom of the gate. Therefore, the electric field applied to the gate oxide film is increased, and the life time of the gate oxide film is reduced. In order to prevent this, a structure is provided such that a p-type deep layer to be an electric field relaxation layer is formed in the vicinity of the trench where the trench gate is formed, so that the electric field applied to the trench gate is relaxed.

SUMMARY

A silicon carbide semiconductor device includes: a vertical semiconductor element, which includes: a semiconductor substrate made of silicon carbide and having a high impurity concentration layer on a back side and a drift layer on a front side; a base region made of silicon carbide on the drift layer; a source region arranged on the base region and made of silicon carbide; a deep layer disposed deeper than the base region; a trench gate structure including a gate insulation film arranged on an inner wall of a gate trench which is arranged deeper than the base region and shallower than the deep layer, and a gate electrode disposed on the gate insulation film; a source electrode electrically connected to the base region, the source region, and the deep layer; and a drain electrode electrically connected to the high impurity concentration layer.

BRIEF DESCRIPTION OF THE DRAWINGS

The above and other objects, features and advantages of the present disclosure will become more apparent from the following detailed description made with reference to the accompanying drawings. In the drawings:

FIG. 5 is a diagram showing the relationship between the top surface layout and the shape of the bottom of the trench in a cross section in a case where the tip of the trench gate structure is not overlapped with the p-type deep layer;

FIG. 6A is a cross-sectional view showing a manufacturing process of the SiC semiconductor device shown in FIG. 2;

FIG. 6B is a cross-sectional view showing a manufacturing process of the SiC semiconductor device continued from FIG. 6A;

FIG. 6C is a cross-sectional view showing a manufacturing process of the SiC semiconductor device continued from FIG. 6B;

FIG. 6D is a cross-sectional view showing a manufacturing process of the SiC semiconductor device continued from FIG. 6C;

FIG. 6E is a cross-sectional view showing a manufacturing process of the SiC semiconductor device continued from FIG. 6D;

FIG. 6F is a cross-sectional view showing a manufacturing process of the SiC semiconductor device continued from FIG. 6E;

FIG. 6G is a cross-sectional view showing a manufacturing process of the SiC semiconductor device continued from FIG. 6F;

FIG. 6H is a cross-sectional view showing a manufacturing process of the SiC semiconductor device continued from FIG. 6G;

DETAILED DESCRIPTION

Figure 1:
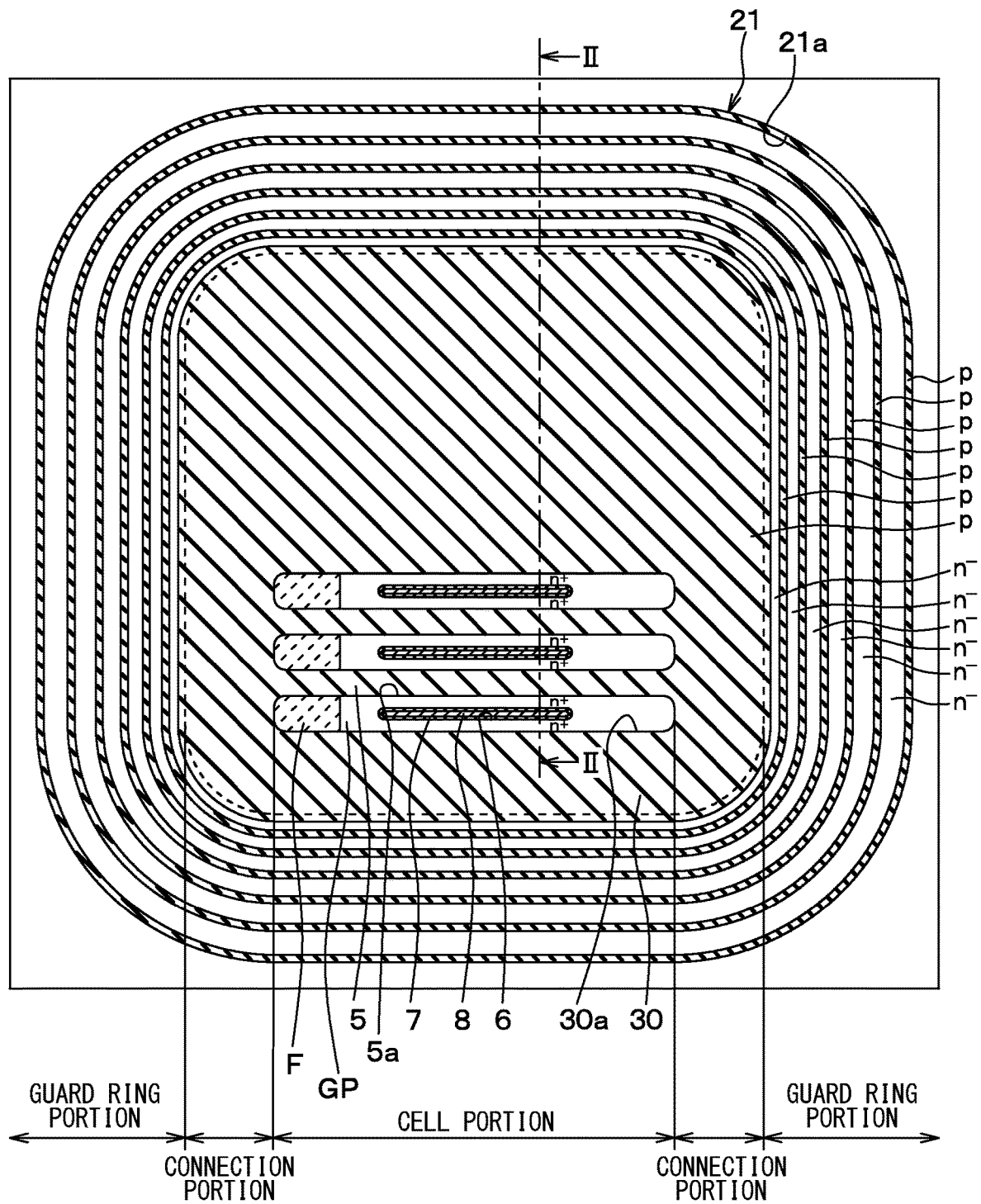
FIG. 1 is a top layout view of a SiC semiconductor device according to a first embodiment.

In the SiC semiconductor device, a cell portion in which an element having a trench gate structure is formed, and a guard ring portion surrounding the periphery of the cell portion are arranged, and a connection portion is arranged between the cell portion and the guard ring portion to connect therebetween. Also in the connection portion, by arranging the p-type deep layer in the surface portion of the n-type drift layer, the equipotential line is extended from the cell portion to the guard ring portion without electric field concentration in the cell portion and the connection portion. The equipotential line is terminated at the guard ring portion.

In such a SiC semiconductor device, an ion implantation method may be a method of forming the p-type deep layer. However, since the SiC is very hard and the ion range of the ion implantation is short, it may be difficult to form the p type deep layer to have a desired depth. Therefore, before performing the ion implantation for the p-type deep layer, it is proposed such that the concavity is formed by etching the n-type drift layer at the p type deep layer to-be-formed area, and then, the p-type impurity is ion-implanted on the bottom of the concavity. In this way, the p-type deep layer may be formed deeper.

In the SiC semiconductor device, a p type deep layer may be formed along the longitudinal direction of the trench gate structure, and the trench gate structure may be disposed between the p-type deep layers. In such a structure, the rising of the electric field toward the bottom of the trench is suppressed by the p type deep layers disposed on both sides of the trench gate structure. Therefore, the concentration of the electric field at the bottom of the trench may be relaxed, so that the gate insulation film is protected.

However, in addition, it is necessary to suppress the influence of the electric field rising at the top of the trench gate structure. For this reason, in addition to arranging the p-type deep layers on both sides of the trench gate structure, it is conceivable to arrange the p-type deep layer so as to overlap with the top of the trench gate structure. By arranging the p-type deep layer so as to overlap with the top of the trench gate structure in this way, the influence of the electric field rising may be suppressed even at the top of the trench gate structure, so that the gate insulation film is protected.

However, as described above, in the case where the p-type deep layer is formed by forming the concavity in the n type drift layer and then implanting ions to form the p-type deep layer deeper, the following difficulties may occur.

That is, since the concavity is formed to form the p-type deep layer deeper, the surface of the p-type base region epitaxially grown on the n-type drift layer and the p-type deep layer does not become flat. Furthermore, a facet surface originating from the concavity is formed on the epitaxial growth surface. For example, an offset substrate is used as a SiC substrate. Further, the longitudinal direction of the trench gate structure is set along the offset direction of the offset substrate. In that case, one end of the trench gate structure overlaps with the facet surface, and the other end overlaps with the irregularity due to the concavity although no facet surface is formed.

Therefore, the depth of the bottom of the trench for forming the trench gate structure becomes uneven, and a bent portion due to the irregularity is formed. Then, at the bent portion of the trench, the thickness of the gate insulation film becomes thin, and a difficulty occurs that the withstand voltage of the gate insulation film may not be obtained sufficiently.

A SiC semiconductor device is provided with securing a withstand voltage of a gate insulation film while forming a deep layer to a deep position.

A SiC semiconductor device according to an example embodiment includes a vertical semiconductor element which includes: a semiconductor substrate made of silicon carbide and having a high impurity concentration layer with a first conductive type or a second conductive type on a back side of the substrate and a drift layer having the first conductive type with a lower impurity concentration than the high impurity concentration layer on a front side of the substrate; a base region made of silicon carbide with the second conductive type and arranged on the drift layer; a source region arranged on the base region, made of silicon carbide, and having the first conductive type with a higher impurity concentration than the drift layer; a deep layer having the second conductive type with a higher impurity concentration and disposed deeper than the base region; a deep layer having the second conductive type with a higher impurity concentration and disposed deeper than the base region; a trench gate structure having one direction as a longitudinal direction and including a gate insulation film arranged on an inner wall of a gate trench and disposed in the gate trench which is arranged deeper than the base region from a surface of the source region and shallower than the deep layer, and a gate electrode disposed on the gate insulation film; a source electrode electrically connected to the base region, the source region, and the deep layer; and a drain electrode electrically connected to the high impurity concentration layer.

The deep layer includes a stripe shape portion arranged on each side of the trench gate structure and disposed along the longitudinal direction of the trench gate structure, and a tip opposing portion arranged to face each end of the trench gate structure; a facet F is disposed in the base region toward the one of both ends of the trench gate structure from the tip opposing portion which faces one of both end of the trench gate structure; a length of the facet F in a direction from the tip opposing portion toward the one of both ends of the trench gate structure is defined as a facet length L; and a distance between the tip opposing portion and the one of both ends of the trench gate structure is longer than the facet length L.

Such a configuration provides to prevent the facet surface from overlapping with the tip of the trench gate structure. Therefore, the depth of the bottom of the trench for providing the trench gate structure becomes uniform, and the gate insulation film is formed without irregularity on the bottom, so that the thickness of the gate insulation film is made constant. Therefore, it is possible to obtain the sufficient withstand voltage of the gate insulation film while forming the deep layer to the deep position.

Embodiments of the present disclosure will be described below with reference to the drawings. In the following embodiments, the same reference numerals are assigned to parts that are the same or equivalent to each other.

First Embodiment

A first embodiment will be described. Here, an SiC semiconductor device in which an inversion type MOSFET having a trench gate structure is formed as a power element providing a semiconductor element will be described as an example.

The SiC semiconductor device shown in FIG. 1 has a cell portion in which a MOSFET having a trench gate structure is formed, and an outer peripheral portion surrounding the cell portion. The outer peripheral portion has a guard ring portion and a connection portion disposed inside the guard ring portion, that is, between the cell portion and the guard ring portion. Although FIG. 1 is not a cross-sectional view, hatching is partially shown in order to make the drawing easily understandable.

Figure 2:
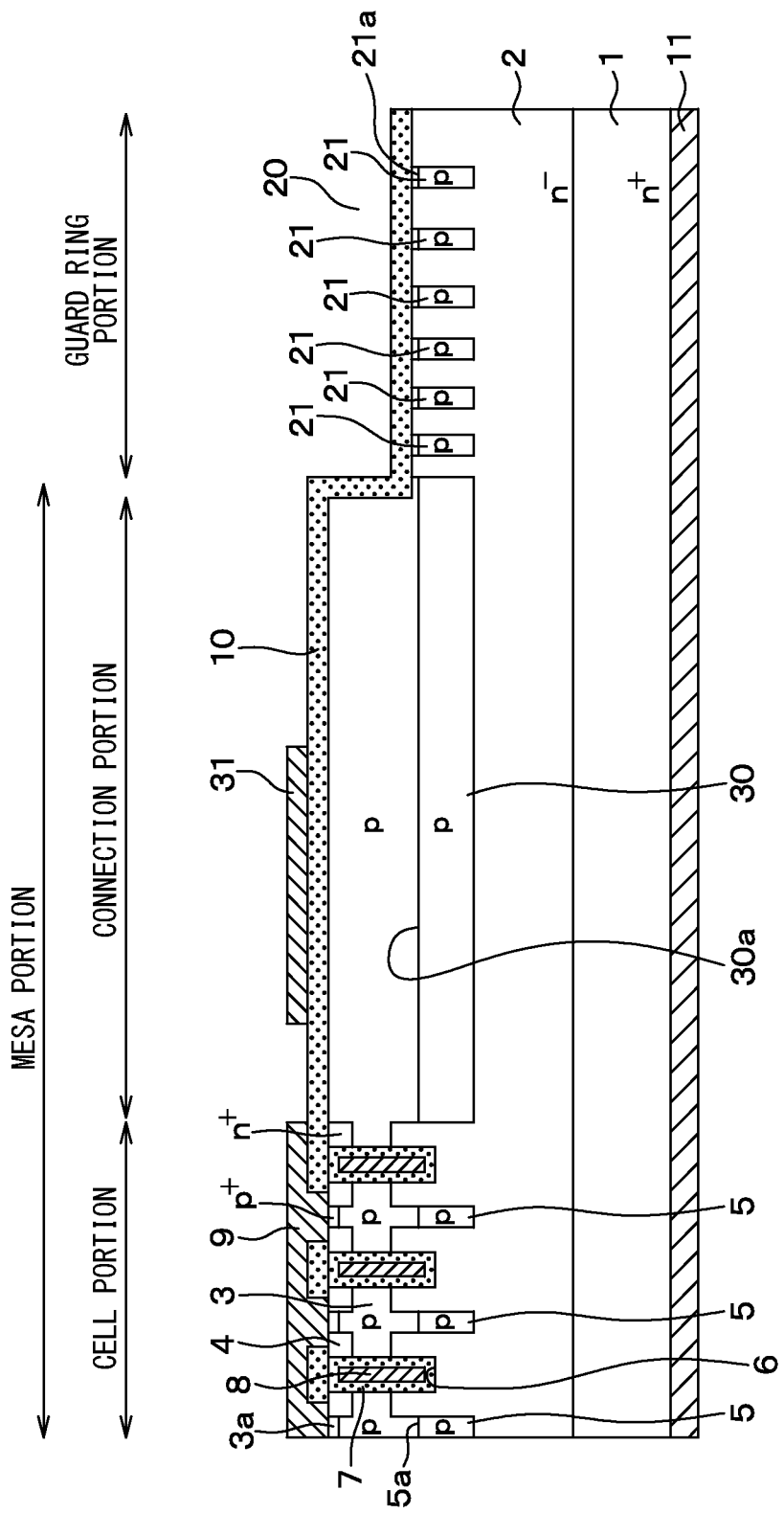
FIG. 2 is a diagram showing a cross-sectional view taken along line II-II of FIG. 1.

As shown in FIG. 2, the SiC semiconductor device is formed using an n$^+$ type substrate 1 made of SiC, and an n$^-$ type drift layer 2 and a p type base region 3 made of SiC are formed as an epitaxial film epitaxially grown on the main surface of the n+ type substrate 1. Furthermore, an n+ type source region 4 is formed on the p type base region 3. The n+ type source region 4 may be an epitaxial film formed by epitaxial growth. Alternatively, in the present embodiment, the region 4 is formed by ion implantation.

The n+ type substrate 1 is an offset substrate that has, for example, an n type impurity concentration of $1.0 \times 10^{19}/cm^3$, a surface of (0001) Si plane, and an off direction of <11-20>. The n− type drift layer 2 has, for example, an n type impurity concentration of $0.5 \times 10^{16}/cm^3$ to $2.0 \times 10^{16}/cm^3$. Here, although the p type base region 3 is directly disposed on the n− type drift layer 2, the p type base region 3 may be disposed on the n− type drift layer 2 via the n type current dispersion layer. The n type current dispersion layer is a layer in which the n type impurity concentration is higher than that of the n− type drift layer 2, so that the resistance is low. By providing this n type current distribution layer, it is possible to distribute and flow the current in a wider range, and to reduce the JFET resistance.

Further, the p type base region 3 has a portion where a channel region is to be formed, and the portion has the p type impurity concentration of, for example, about $2.0 \times 10^{17}/cm^3$ and the thickness of 300 nm. In the surface portion of the p type base region 3, that is, a place sandwiched by the n+ type source region 4, a p type contact region 3a in which the p type impurity is partially high is formed. The n+ type source region 4 has a higher impurity concentration than the n− type drift layer 2, and has the n type impurity concentration in the surface portion of, for example, $2.5 \times 10^{18}/cm^3$ to $1.0 \times 10^{19}/cm^3$, and the thickness of about 0.5 μm.

In the cell portion, the p type base region 3 and the n+ type source region 4 are left on a front surface side of the n+ type substrate 1, and in the guard ring portion, a recess portion 20 is provided so as to penetrate the p type base region 3 and to reach the n− type drift layer 2. By adopting such a structure, a mesa structure is formed.

In the cell portion, a p type deep layer 5 having a p-type impurity concentration higher than that of the p type base region 3 is formed in the surface portion of the n− type drift layer 2. More specifically, the p type deep layer 5 is formed by ion-implanting p type impurities into the bottom of recess 5a formed by etching the surface of the n− type drift layer 2 at the p type deep layer to be formed portion is formed. The depth of the recess 5a is, for example, 0.3 to 0.6 μm, and the p type deep layer 5 is formed at a deeper position than the recess 5a.

A plurality of p type deep layers 5 are arranged at equal intervals in the n− type drift layer 2 and are arranged in a stripe shape by being spaced apart from each other without crossing each other, and constitute a stripe-like portion. The p type base region 3 and the n+ type source region 4 described above are formed on the p type deep layer 5.

Each p type deep layer 5 is formed to have the same impurity concentration, the same width, and the same depth. For example, the p type impurity concentration is in a range between $1.0 \times 10^{17}$ $cm^3$ and $1.0 \times 10^{19}$ $cm^3$, the width is 0.7 μm, and the depth is about 2.0 μm. Each p type deep layer 5 is formed from one end to the other end of the cell portion as shown in FIG. 1. The p type deep layer 5 is extended along the same direction as the trench gate structure to be described later as a longitudinal direction, and is further connected to the p type deep layer 30 in the connection portion which is described later and extended to the outside of the cell portion from both ends of the trench gate structure.

The extending direction of the p type deep layer 5, that is, the extending direction of the recess 5a may be any direction. In this embodiment, the extending direction is the <11-20> direction same as the offset direction. By extending the p type deep layer 5 in such a direction, both opposing wall surfaces constituting the long sides of the recess 5a can be made to be the same (1-100) plane, and the growth at the time of epitaxial growth for embedding can be equalized on both opposing walls. Therefore, the p type base region 3 formed so as to embed the recess 5a can be made to have a uniform film quality, and the effect of suppressing the embedding failure can also be obtained.

The p type deep layer 5 is formed in the n− type drift layer 2 when the p type base region 3 is formed directly on the n− type drift layer 2. When the p type base region 3 is formed on the n− type drift layer 2 via the n type current distribution layer, the p type deep layer 5 is formed in the n type current distribution layer. In that case, the bottom of the p type base region 3 is shallower than the n type current distribution layer, that is, the n type current distribution layer is left between the bottom of the p type base region 3 and the n− type drift layer 2, so that it is preferable that the current distribution is also performed in that portion.

In addition, for example, the gate trench 6 is formed to have the width of 0.8 μm and the depth of 1.0 μm so that the trench 6 penetrates the p type base region 3 and the n+ type source region 4 and reaches the n− type drift layer 2, and the trench 6 is shallower than the p type deep layer 5. The above described p type base region 3 and n+ type source region 4 are arranged so as to be in contact with the side surface of the gate trench 6. The gate trench 6 is formed in a line-like layout in which the lateral direction of the drawing in FIG. 2 is defined as the width direction, the direction perpendicular to the drawing is defined as the longitudinal direction, and the vertical direction of the drawing is defined as the depth direction. In addition, as shown in FIG. 1, a plurality of gate trenches 6 are arranged so as to be sandwiched between p type deep layers 5, respectively, and are arranged in a stripe shape manner in parallel to each other at equal intervals.

In addition, a gate insulation film 7 is formed on an inner wall surface of the gate trench 6 including a channel region while a portion of the p type base region 3 located on a side surface of the gate trench 6 is defined as the channel region connecting the n+ type source region 4 and the n− type drift layer 2 when a vertical MOSFET is operated. A gate electrode 8 made of doped Poly-Si is formed on the surface of the gate insulation film 7, and the inside of the gate trench 6 is filled with the gate insulation film 7 and the gate electrode 8. These provide a trench gate structure. In FIG. 1, the trench gate structures and the p type deep layers 5 are illustrated with reducing the number thereof to simplify the drawing. Many similar structures are actually arranged.

The tip of the trench gate structure is separated from the p type deep layer 30 described later by a predetermined distance. Therefore, the trench gate structure is arranged in a region (hereinafter, referred to as a gate arrangement region) GP surrounded by the p type deep layer 5 and the p type deep layer 30. In the case of the present embodiment, the distances from both ends of the trench gate structure to the p type deep layer 30 are equal. The distances from both ends of the trench gate structure to the p type deep layer 30 will be described in detail later.

On the surfaces of the n+ type source region 4 and the p type deep layer 5, and on the surface of the gate electrode 8, a source electrode 9 corresponding to the first electrode and a gate pad 31 arranged in an electrode pad portion are formed through the interlayer insulation film 10. The source electrode 9 and the gate pad 31 are made of a plurality of metals, for example, Ni/Al or the like. N type SiC among a plurality of metals, specifically, at least a portion in contact with the n+ type source region 4 and the gate electrode 8 in case of n type impurity doping, is made of a metal capable of ohmic contact with the n type SiC. In addition, at least a portion in contact with p type SiC among the plurality of metals, specifically, the p type deep layer 5, is made of a metal capable of ohmic contact with the p type SiC. Here, the source electrode 9 and the gate pad 31 are formed on the interlayer insulation film 10 to be electrically insulated. Then, through the contact hole formed in the interlayer insulation film 10, the source electrode 9 is electrically connected to the n+ type source region 4 and the p type contact region 3a, and the gate pad 31 is electrically connected to the gate electrode 8.

Further, a drain electrode 11 corresponding to a second electrode electrically connected to the n+ type substrate 1 is formed on the back side of the n+ type substrate 1. With such a structure, an n channel inversion type trench gate structure MOSFET is provided. Then, a plurality of such MOSFETs are arranged in a plurality of cells respectively to form a cell portion.

On the other hand, in the guard ring portion, as described above, the recess 20 is formed to penetrate the p type base region 3 and reach the n− type drift layer 2. Therefore, the n+ type source region 4 and the p type base region 3 are removed at a position distant from the cell portion, and the n− type drift layer 2 is exposed. In the thickness direction of the n+ type SiC substrate 1, a cell portion and a connection portion located inside the recess 20 provide a mesa portion protruding like an island.

A plurality of p type guard rings 21 are arranged in the surface layer portion of the n− type drift layer 2 located below the recess 20 so as to surround the cell portion. In the case of the present embodiment, the p type guard ring 21 has a quadrangular shape in which the four corners are rounded. Alternatively, the ring 21 may have another frame shape such as a circular shape. The p type guard ring 21 is formed by ion-implanting p type impurities into the bottom of the recess 21a formed in the n− type drift layer 2. Although the recess 21a may be eliminated depending on the depth of the recess 20 for forming the mesa portion. FIG. 2 shows a case where the recess 21a remains. When the recess 21a remains, a part of the p type base region 3 remains in the recess 21a.

Each part constituting the p type guard ring 21 has the same structure as the above described p type deep layer 5. The p type guard ring 21 is different from the p type deep layer 5 formed in a straight line shape about a feature such that the top surface shape of the ring 21 has a line shape with a frame surrounding the cell portion and the connection portion. The other features are similar. That is, the p type guard ring 21 has the same impurity concentration, the same width and the same depth as the p type deep layer 5. The intervals between the p type guard rings 21 may be equal to each other. Alternatively, the intervals between the guard rings 21 may be narrower at the side of the cell portion and wider toward the outer peripheral side, so that the electric field concentration is relaxed more on the inner circumferential side, that is, on the cell portion side, and the equipotential line directs to more outer peripheral side.

Although not shown in the drawings, the EQR structure is arranged on the outer periphery of the p type guard ring 21 as necessary, so that a guard ring portion having an outer peripheral withstand voltage structure surrounding the cell portion is provided.

Figure 3:
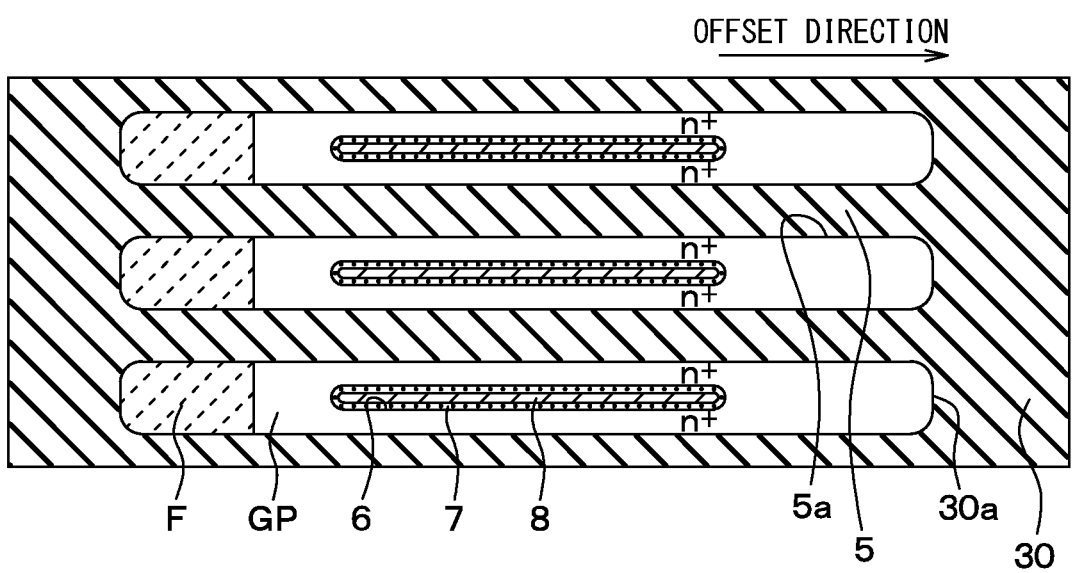
FIG. 3 is a partial enlarged view of the vicinity of the trench gate structure in FIG. 1.

Furthermore, a p type deep layer 30 is formed in the surface layer portion of the n− type drift layer 2 at the connection portion, provided by a portion extending from the cell portion to the guard ring portion as the connection portion. The p type deep layer 30 is fixed to the source potential because it is in contact with the p type base region 3. In the case of the present embodiment, as shown by solid hatching in FIG. 1, a connection portion is formed to surround the cell portion, and a plurality of p type guard rings 21 having a quadrangular shape with four corners rounded are formed so as to surround the outside of the connection portion. The p type deep layer 30 is formed in a solid hatched portion which is a connection portion, and is connected to the p type deep layer 5 formed in the cell portion. For this reason, as shown in FIGS. 1 and 3, the p type deep layer 30 constitutes a tip opposing portion disposed facing both ends of the trench gate structure, and surrounds the trench gate structure together with the p type deep layer 5.

Each p type deep layer 30 is formed by ion-implanting a p-type impurity into the bottom of the recess 30a formed on the surface of the n− type drift layer 2. The impurity concentration and the depth of the p type deep layer 30 are similar to those of the p type deep layer 5 and the p type guard ring 21 described above.

In the present embodiment, the side of the p type deep layer 30 opposite to both ends of the trench gate structure is rounded. Therefore, the gate arrangement region GP has a line shape with a rounded tip. The distance between the p type deep layer 30 and the tip of the trench gate structure is designed in consideration of the formation range of the facet F. The distance between the p type deep layer 30 and the tip of the trench gate structure will be described below.

As in the present embodiment, an offset substrate having an offset direction of <11-20> is used as the n+ type substrate 1, and the extending direction of the recess 5a for forming the p type deep layer 5 is the same as the off direction, i.e., the <11-20> direction, the facet F is formed at one end of the gate arrangement region GP. The part shown by a solid hatching in FIG. 3 is the facet F. The facets F are formed due to the plane orientation dependency of the epitaxial growth. Specifically, at a position corresponding to one surface of the recess 5a in which the normal direction is the <11-20> direction, the facet F is formed to be inclined to the surface of the p type deep layer 5 along the offset direction.

The formation range of facet F is determined by the thickness of p type base region 3 and n+ type source region 4 formed on the p type deep layer 5 and the n− type drift layer 2, the offset angle of the n+ type substrate 1, and the depth of the recess 5a. The range can be determined by calculation. Specifically, the length of the facet F in the direction from the p type deep layer 30 toward the tip of the trench gate structure, i.e., in the offset direction in the case of this embodiment, is defined as the facet length L. The facet length L is calculated in the following equation based on the film thickness t of the p type base region 3 and the n+ type source region 4, the offset angle θ and the depth d of the recess 5a.

$$\text{Facet length } L=(t-d)/\tan\theta \quad \text{(Equation 1)}$$

Based on the facet length L determined in this manner, the distance between the p type deep layer 30 and the tip of the trench gate structure is designed to be a length so as not to overlap the facet F with the tip of the trench gate structure when seeing in the normal direction with respect to the surface of the n+ type substrate 1. For example, when the film thickness t is 0.8 μm, the offset angle θ is 4 degrees, and the etching amount of the recess 5a is 0.4 μm, the facet length L is about 6 μm.

Here, the distance between the p type deep layer 30 and the tip of the trench gate structure is a distance from the point of intersection of the p type deep layer 30 with the center line along the longitudinal direction of the trench gate structure to the tip of the gate structure.

Further, the facet F is formed along the offset direction, and formed to arrange the upstream side of the offset direction at the recess 5a and to arrange the downstream side at a position at which the facet has a protruding shape. The facet F is not formed to arrange the upstream side of the offset direction at a position at which the facet has a protruding shape and to arrange the downstream side at the recess 5a. Therefore, in the case of the present embodiment, the facet F is formed at the end of the gate arrangement region GP on the left side of the drawing in FIG. 3. The facet F is not formed at the end on the right side of the drawing. However, in the case of this embodiment, the distances from both ends of the trench gate structure to the p type deep layer 30 are equalized such that the gate arrangement region GP has a symmetrical shape in the longitudinal direction of the trench gate structure with the trench gate structure as the center.

By forming such a p type deep layer 30 and designing a predetermined interval between the p type deep layers 5, excessive rising of the equipotential lines in the region surrounded by these, i.e., in the gate arrangement region GP is restricted. Thereby, it is possible to suppress the formation of a portion where the electric field concentration occurs between the p type deep layers 30, and it is possible to suppress the reduction in a breakdown voltage.

Further, as described above, since the side of each p type deep layer 30 opposing both ends of the trench gate structure is rounded, the upper surface shape of the gate arrangement region GP is formed into a line shape with the rounded tip. The upper surface shape of both ends of the gate arrangement region GP may be square, but electric field concentration may occur at the corner. For this reason, electric field concentration can be relaxed by designing the shape of the gate arrangement region GP with a tip having a rounded shape as in the present embodiment.

Also in the connection portion, the interlayer insulation film 10 is formed on the surface of the n$^+$ type source region 4. The gate pad 31 described above is formed on the interlayer insulation film 10 at the connection portion.

As described above, the p type deep layer 5 disposed on both sides of the trench gate structure is connected by providing a structure having the connection portion between the cell portion and the guard ring portion and forming the p type deep layer 30 in the connection portion. Thereby, the equipotential line is restricted from excessively rising in the gate arrangement region GP, the equipotential line extends from the cell portion toward the guard ring portion, and terminates at the guard ring portion.

With the above structure, the SiC semiconductor device according to the present embodiment is configured. In the SiC semiconductor device configured as described above, when the MOSFET turns on, by controlling the voltage applied to the gate electrode 8, a channel region is formed in the surface portion of the p type base region 3 located on the side surface of the gate trench 6. Thus, a current flows between the source electrode 9 and the drain electrode 11 via the n$^+$ type source region 4 and the n$^-$ type drift layer 2.

Further, even when a high voltage is applied while the MOSFET turns off, the p type deep layer 5 and the p type deep layer 30 formed to a deeper position than the trench gate structure suppress the penetration of the electric field to the bottom of the gate trench. Therefore, the electric field concentration at the bottom of the gate trench is reduced. As a result, the breakdown of the gate insulation film 7 is prevented.

Furthermore, the distance between the p type deep layer 30 and the tip of the trench gate structure is designed such that the facet F does not overlap with the tip of the trench gate structure as viewed from the normal direction to the surface of the n$^+$ type substrate 1. Therefore, the depth of the bottom of the trench 6 for providing the trench gate structure becomes uniform, and the gate insulation film 7 is formed without irregularity on the bottom, so that the thickness of the gate insulation film 7 is made constant. This will be described with reference to FIGS. 4 and 5.

Figure 4:
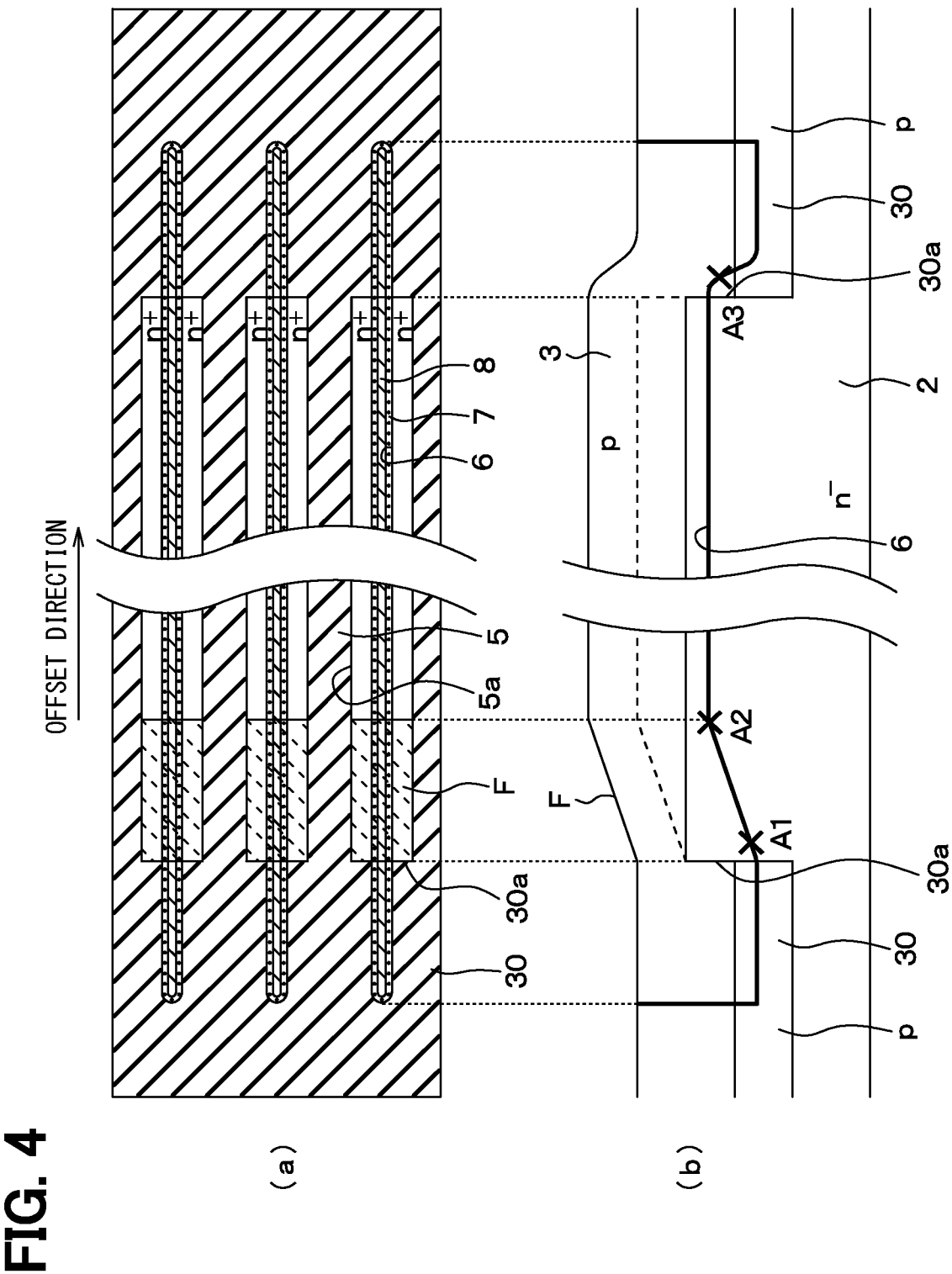
FIG. 4 is a diagram showing the relationship between the top surface layout and the shape of the bottom of the trench in a cross section when the tip of the trench gate structure is overlapped with the p-type deep layer.
Figure 7A:
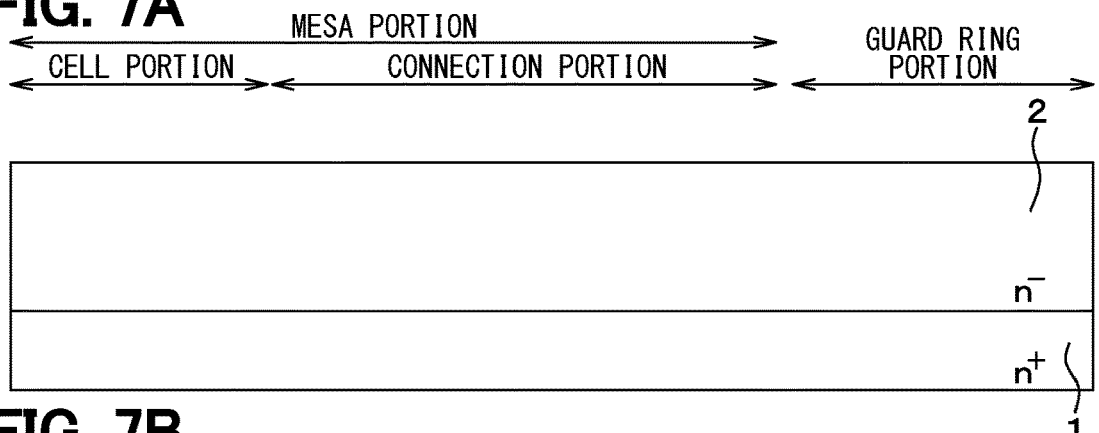
FIG. 7A is a cross-sectional view showing a manufacturing process of a SiC semiconductor device according to the second embodiment.
Figure 7B:
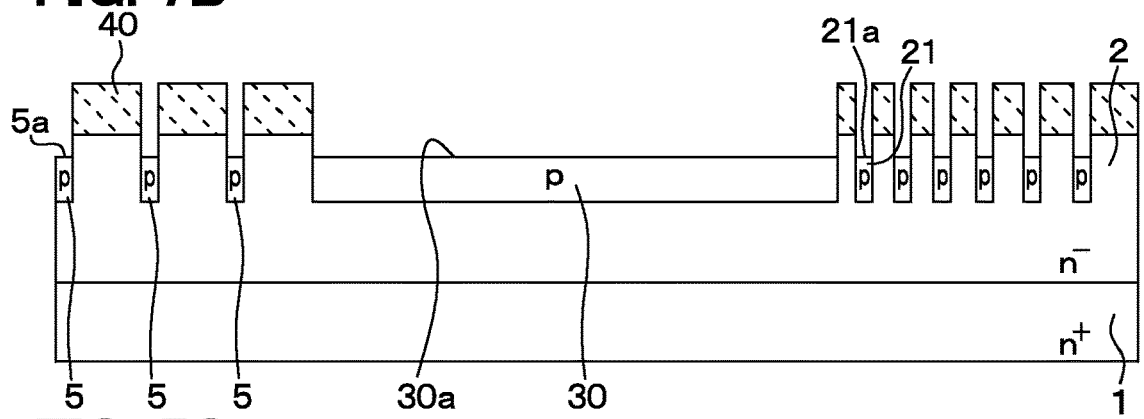
FIG. 7B is a cross-sectional view showing a manufacturing process of the SiC semiconductor device continued from FIG. 7A.
Figure 7C:
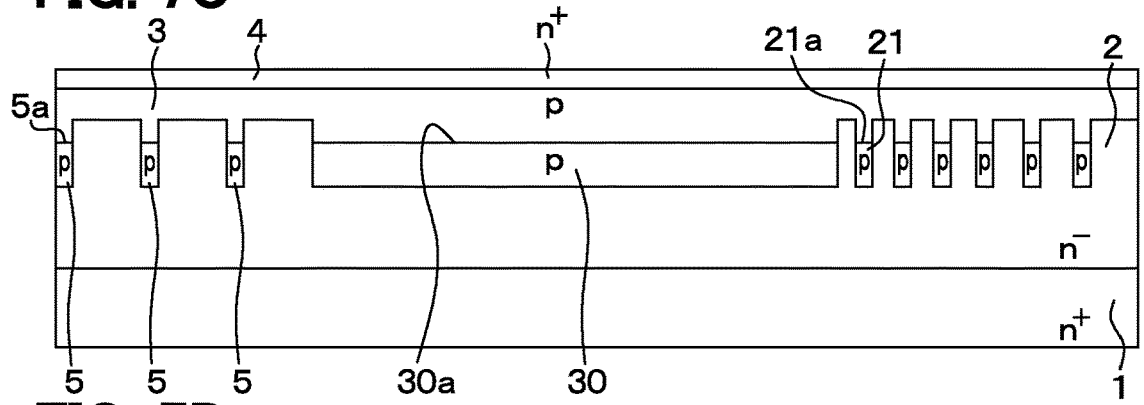
FIG. 7C is a cross-sectional view showing a manufacturing process of the SiC semiconductor device continued from FIG. 7B.
Figure 7D:
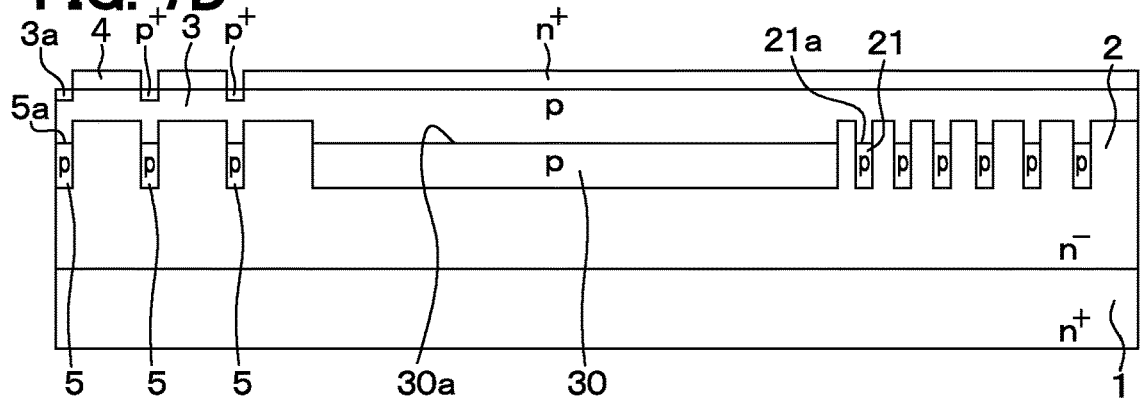
FIG. 7D is a cross-sectional view showing a manufacturing process of the SiC semiconductor device continued from FIG. 7C.

FIG. 4 shows the relationship of each part when the tip of the trench gate structure is arranged so as to overlap with the p type deep layer 30 as a conventional example. Further, FIG. 5 shows the relationship of each part when the tip of the trench gate structure is arranged so as not to overlap with the facet F as in the present embodiment.

As shown in FIG. 4 and FIG. 5, when the recess 30a is formed, the facet F is formed along the offset direction, so in the portion of the trench gate structure where the tip on the left side is located, irregularities are formed on the surfaces of the p type base region 3 and the n$^+$ type source region 4.

Then, as shown in FIG. 4, when the tip of the trench gate structure is arranged so as to overlap with the p type deep layer 30, the tip of the trench gate structure is arranged so as to overlap with the facet F. Therefore, the bottom of the trench 6 has the same shape as the surface of the n$^+$ type source region 4 as indicated by a thick line in the drawing, and has a shape with the irregularity similar to the facet F. Therefore, when the gate insulation film 7 is formed in the trench 6, the film thickness of the gate insulation film 7 becomes thin at the bent portions shown by points A1 and A2 in the drawing and in the vicinity thereof, so that the withstand voltage of the gate insulation film 7 is not sufficiently obtained.

Further, also in the portion of the trench gate structure where the tip on the right side in the drawing is located, irregularity is formed on the surface of p type base region 3 and n$^+$ type source region 4 due to the formation of the recess 30a. Therefore, when the tip of the trench gate structure is arranged to overlap with the p type deep layer 30, the bottom of the trench 6 has the same shape as the surface of the n$^+$ type source region 4 as shown by the broken line in the drawing, so the bottom has a shape with the irregularity corresponding to the recess 30a. Therefore, when gate insulation film 7 is formed in trench 6, the film thickness of gate insulation film 7 becomes thin at the bent portion shown by point A3 in the drawing and in the vicinity thereof, and the withstand voltage of gate insulation film 7 is not obtained sufficiently.

Therefore, when the tip of the trench gate structure is arranged so as to overlap with the p type deep layer 30 as in conventional example, the withstand voltage of the gate insulation film 7 is not obtained sufficiently.

On the other hand, as shown in FIG. 5, when the tip of the trench gate structure does not overlap with facet F, the trench 6 is formed at a position where the surface of the n$^+$ type source region 4 is flat as shown by the broken line in the drawing.

Further, also in the portion of the trench gate structure where the tip on the right side in the drawing is located, irregularity is formed on the surface of p type base region 3 and the n$^+$ type source region 4 due to the formation of the recess 30a. However, since the tip of the trench gate structure is separated from the p type deep layer 30, the surfaces of the p type base region 3 and the n+ type source region 4 are flat at the position where the trench 6 is to be formed.

Therefore, the bottom of the trench 6 also has a flat shape. Therefore, when the gate insulation film 7 is formed in the trench 6, the film thickness of the gate insulation film 7 formed on the flat shape becomes uniform. Thus, the withstand voltage of the gate insulation film 7 is sufficiently obtained.

As a reference, a TZDB (Time Zero Dielectric Breakdown) test and a high temperature reverse bias test which are generally used as a withstand voltage test of a gate insulation film are performed by an experiment. No breakage of the gate insulation film 7 is observed. For this reason, it can be understood from this experimental result also that the above effect is obtained.

Subsequently, a method of manufacturing the SiC semiconductor device according to this embodiment will be described with reference to FIG. 6A to FIG. 6H.

[Process Shown in FIG. 6A]

First, a semiconductor substrate is prepared by epitaxially growing an n− type drift layer 2 made of SiC on the main surface of an n+ type substrate 1.

[Process Shown in FIG. 6B]

Subsequently, the mask 40 is arranged, and the mask 40 is opened in a region where the p type deep layer 5, the p type deep layer 30, and the p type guard ring 21 are to be formed. Then, anisotropic etching process such as RIE (Reactive Ion Etching) or the like is performed using the mask 40 so that the recesses 5a, 21a, and 30a are formed. Further, p type impurities are ion implanted using the mask 40. Thereby, the p type deep layer 5, the p type deep layer 30, and the p type guard ring 21 are formed.

[Process Shown in FIG. 6C]

After the mask 40 is removed, the p type base region 3 is epitaxially grown on the n− type drift layer 2 including the p type deep layer 5, the p type deep layer 30 and the p type guard ring 21. At this time, although not described in FIG. 6A to FIG. 6H, as shown in FIG. 5, the facet F is formed on the surface of the p type deep layer 30 attributed to the formation of the recess 30a.

[Process Shown in FIG. 6D]

After arranging a mask not shown on the p type deep layer 30, an area of the mask is opened where the n+ type source region 4 is to be formed. Then, the n+ type source region 4 is formed by ion-implanting an n type impurity using the mask. Furthermore, after removing the mask, a mask not shown is arranged again, and an area of the mask is opened where the p type contact region 3a is to be formed. Then, the p type contact region 3a is formed by ion-implanting p type impurities using the mask.

[Process Shown in FIG. 6E]

After a mask not shown is formed on the n+ type source region 4 and the p type base region 3 and the like, a region of the mask is opened where the gate trench 6 is to be formed. Then, an anisotropic etching process such as RIE is performed using the mask to form the gate trench 6 having a depth shallower than that of the p type deep layer 5.

Further, after the mask is removed, a mask not shown is formed again, and a region of the mask is opened where the recess 20 is to be formed. Then, the recess 20 is formed by performing anisotropic etching process such as RIE using a mask. Thus, a structure is provided such that the n− type drift layer 2 is exposed through n+ type source region 4 and the p type base region 3 at the position where the recess 20 is formed, and a plurality of p type guard rings 21 are arranged on the surface of the n− type drift layer 2.

Although the gate trench 6 and the recess 20 are formed in separate processes using different masks. Alternatively, they may be formed simultaneously using the same mask.

[Step Shown in FIG. 6F]

After the mask is removed, the gate insulation film 7 is formed by performing thermal oxidation, for example, so that the gate insulation film 7 covers the inner wall surface of the gate trench 6 and the surface of the n+ type source region 4. Then, after depositing Poly-Si doped with p type impurities or n type impurities, Poly-Si is etched back to remain at least Poly-Si in the gate trench 6 to form the gate electrode 8.

[Step Shown in FIG. 6G]

An interlayer insulation film 10 made of, for example, an oxide film or the like is formed to cover the surfaces of the gate electrode 8 and the gate insulation film 7. Then, after forming a mask not shown on the surface of interlayer insulation film 10, a portion of the mask located between gate electrodes 8, i.e., a portion corresponding to the p type contact region 3a and the vicinity thereof are opened. Thereafter, the interlayer insulation film 10 is patterned using the mask to form contact holes for exposing the p type contact region 3a and the n+ type source region 4.

[Step Shown in FIG. 6H]

On the surface of the interlayer insulation film 10, for example, an electrode material constituted by a stacking structure of a plurality of metals is formed. Then, the electrode material is patterned to form the source electrode 9 and the gate pad 31. Note that a gate lead-out portion connected to the gate electrode 8 of each cell is provided in a cross section different from that in the drawing. By opening a contact hole in interlayer insulation film 10 at the lead-out portion, electrical connection between the gate pad 31 and the gate electrode 8 is obtained.

Although the process thereafter is not illustrated, the process of forming the drain electrode 11 on the back surface side of the n+ type substrate 1 is performed to complete the SiC semiconductor device according to the present embodiment.

As described above, in the present embodiment, the facet F does not overlap with the tip of the trench gate structure as viewed in the normal direction with respect to the surface of the n+ type substrate 1. Therefore, the depth of the bottom of the trench 6 for providing the trench gate structure becomes uniform, and the gate insulation film 7 is formed without irregularity on the bottom, so that the thickness of the gate insulation film 7 is made constant. Therefore, it is possible to obtain the withstand voltage of the gate insulation film 7 sufficiently while forming the p type deep layer 5 and the p type deep layer 30 to a deep position.

Second Embodiment

The second embodiment will be described. The present embodiment is the same as the first embodiment except that the manufacturing method is changed from the first embodiment, and therefore, features different from the first embodiment will be mainly described.

A method of manufacturing the SiC semiconductor device according to the present embodiment will be described with reference to FIGS. 7A to 7D. First, as steps shown in FIGS. 7A and 7B, the same steps as those in FIGS. 6A and 6B described in the first embodiment are performed. Then, as a step shown in FIG. 7C, the n+ type source region 4 is epitaxially grown on the surface of p type base region 3. Thereafter, as a step shown in FIG. 7D, a mask not shown is disposed on the surface of n+ type source region 4, and then the mask is opened in a region where the p type contact region 3a is to be formed. Then, the n+ type source region 4 is partially removed by performing the anisotropic etching process such as RIE using the mask to expose the p type base region 3. Further, p type impurities are ion-implanted using the mask. Thereby, the p type contact region 3a is formed.

After that, the same steps as in FIGS. 6E to 6H are performed to complete the SiC semiconductor device having the same configuration as that of the first embodiment. Thus, the n+ type source region 4 may be formed by epitaxial growth on the p type base region 3.

Third Embodiment

A third embodiment will be described. The present embodiment is the same as the first and second embodiments except that the shape of the gate arrangement region GP is changed with respect to the first and second embodiments. Only the differences from the first and second embodiments will be described.

Figure 8:
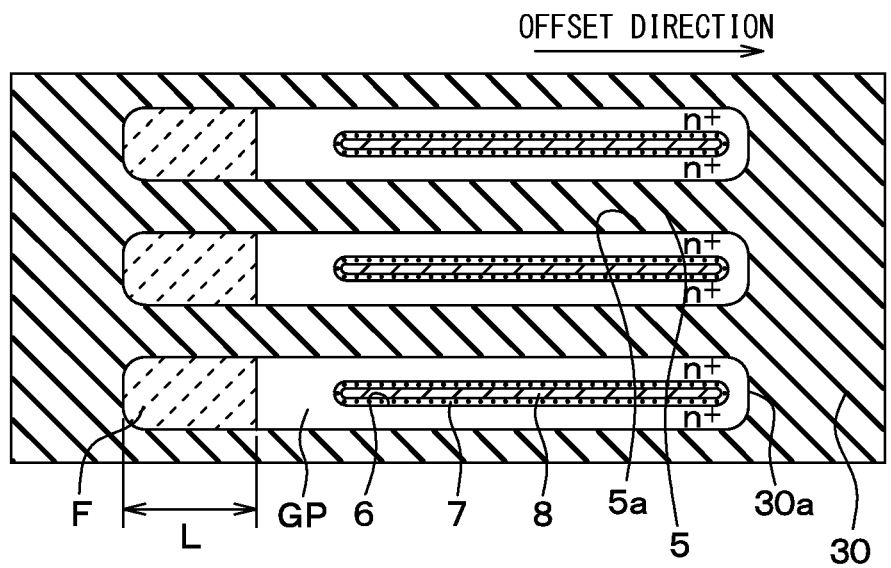
FIG. 8 is a partial enlarged view of the vicinity of a trench gate structure in the SiC semiconductor device according to the third embodiment.

As shown in FIG. 8, in the present embodiment, in the longitudinal direction of the trench gate structure, the shape of the gate arrangement region GP with respect to the trench gate structure as a center is asymmetric. Specifically, for the tip of the trench gate structure on the side where the facet F is formed, the distance between the p type deep layer 30 and the tip of the trench gate structure is equal to or greater than the facet length L. The distance between the other end and the p type deep layer 30 is shorter than the facet length L, only by separating the other end from the p type deep layer 30.

As described above, the facet F is only formed at a position corresponding to one tip of the trench gate structure, and not formed at a position corresponding to the other tip. Therefore, when the distance between the p type deep layer 30 and the tip of the trench gate structure is equal to or greater than the facet length L at least on the side where the facet F is formed, and the other tip is separated from the p type deep layer 30, the bottom of the trench 6 is made flat.

As described above, even when the shape of the gate arrangement region GP around the trench gate structure as a center is asymmetric in the longitudinal direction of the trench gate structure, the same effect as that of the first embodiment is obtained. Further, in the case of such a layout, since the ineffective region in which the channel is not formed can be reduced, it is possible to increase the ratio of the effective area to the area of the chip on which the SiC semiconductor device is formed. Further, it is possible to reduce the on-state resistance.

Fourth Embodiment

A fourth embodiment will be described. The present embodiment is different from the first to third embodiments in the shape of the gate arrangement region GP, and the other parts are the same as the first to third embodiments. Therefore, only the differences from the first to third embodiments will be described. Here, as in the third embodiment, the case where the structure of the present embodiment is applied to a layout in which the gate arrangement region GP has an asymmetrical shape will be described as an example.

Figure 9:
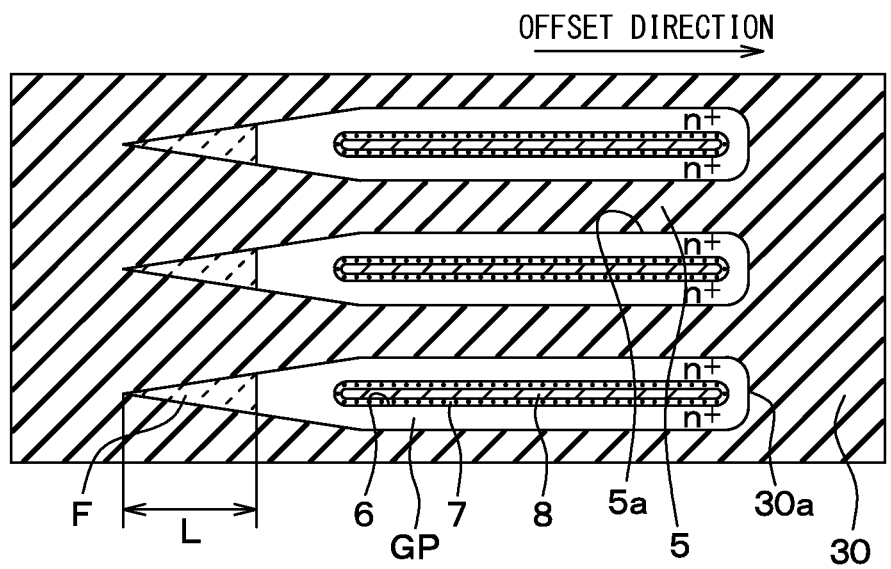
FIG. 9 is a partial enlarged view of the vicinity of a trench gate structure in a SiC semiconductor device according to a fourth embodiment.

As shown in FIG. 9, in the present embodiment, the width of the gate arrangement region GP is narrowed by widening the width of the p type deep layer 5 at the end of the gate arrangement region GP on which the facet F is to be formed. More specifically, the width of the gate arrangement region GP is gradually narrowed from the tip of the trench gate structure to the facet side tip so that the tip on the side where the facet F is formed in the gate arrangement region GP (hereinafter referred to as the facet side tip) is acute. The width of the gate arrangement region GP is changed by inclining the p type deep layer 5 linearly with respect to the offset direction as viewed from the normal direction with respect to the surface of the n+ type substrate 1.

Since the gate placement region GP is surrounded by the p type deep layer 5 and the p type deep layer 30, it is possible to suppress the excessive rise of the electric field. However, in the region where the trench gate structure is formed, although the excessive rise of the electric field can be further suppressed by the push back effect of the electric field by the gate electrode 8 and the like, the rise of the electric field may be increased compared with the region where the trench gate structure is not formed.

Actually, light emission analysis shows that the electric field in the region where the trench gate structure is not formed is relatively large in case of an off state, and the breakdown occurs at this position so that the withstand voltage is reduced in case of a certain design. When a simulation is performed for the purpose of confirming this phenomenon, the electric field strength is high at the corner of the bottom of the p type deep layer 5 at the position where the trench gate structure is not formed, and the breakdown may occur at this position so that the decrease in the withstand voltage occur.

Therefore, as in the present embodiment, by narrowing the width of the gate arrangement region GP at the facet side tip, it is possible to further suppress the rise of the electric field in the region where the trench gate structure is not arranged. As a result, it is possible to suppress an excessive rise of the electric field due to a feature that the tip of the trench gate structure does not overlap with the p type deep layer 30, and it is possible to further improve the withstand voltage of the SiC semiconductor device.

Here, as in the third embodiment, the case where the structure of the present embodiment is applied to the layout in which the gate arrangement region GP has an asymmetrical shape is described as an example. Alternatively, it is applicable to the layout in which the gate arrangement region GP has an symmetrical shape as in the first and second embodiments. In that case, the tip of the gate arrangement region GP on the side opposite to the facet side tip may also have the same shape as the facet side tip.

Fifth Embodiment

A fifth embodiment will be described. The present embodiment is different from the fourth embodiment in the shape of the gate arrangement region GP, and the other parts are the same as the fourth embodiment. Therefore, only the differences from the fourth embodiment will be described.

Figure 10:
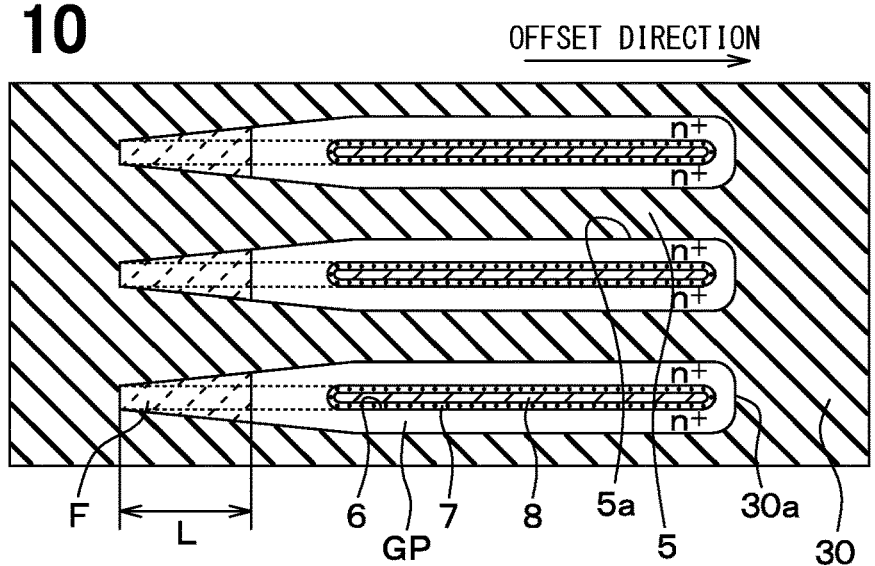
FIG. 10 is a partial enlarged view of the vicinity of a trench gate structure in the SiC semiconductor device according to the fifth embodiment.

As shown in FIG. 10, in the present embodiment, the facet side tip in the gate arrangement region GP is not made sharp although the width thereof is narrowed. That is, the width of the end of the gate arrangement region GP on the side where the facet F is formed is made narrower than the width at a position where the trench gate structure is formed while the width is equal to or larger than the width of the trench gate structure. In addition, with respect to the side of the p type deep layer 30 facing the tip of the trench gate structure, a width equal to or greater than the width of the trench gate structure remains. Then, the width of the gate arrangement region GP is gradually narrowed from the tip of the trench gate structure to the facet side tip. The width of the gate arrangement region GP is changed by inclining the p type deep layer 5 linearly with respect to the offset direction as viewed from the normal direction with respect to the surface of the n+ type substrate 1.

Even with such a structure, since the width of the gate arrangement region GP can be narrowed to the vicinity of the tip of the trench gate structure, it is possible to suppress the rise of the electric field and further to improve the withstand voltage of the SiC semiconductor device.

Sixth Embodiment

A sixth embodiment will be described hereafter. The present embodiment is different from the fourth embodiment in the shape of the gate arrangement region GP, and the other parts are the same as the fourth embodiment. Therefore, only the differences from the fourth embodiment will be described.

Figure 11:
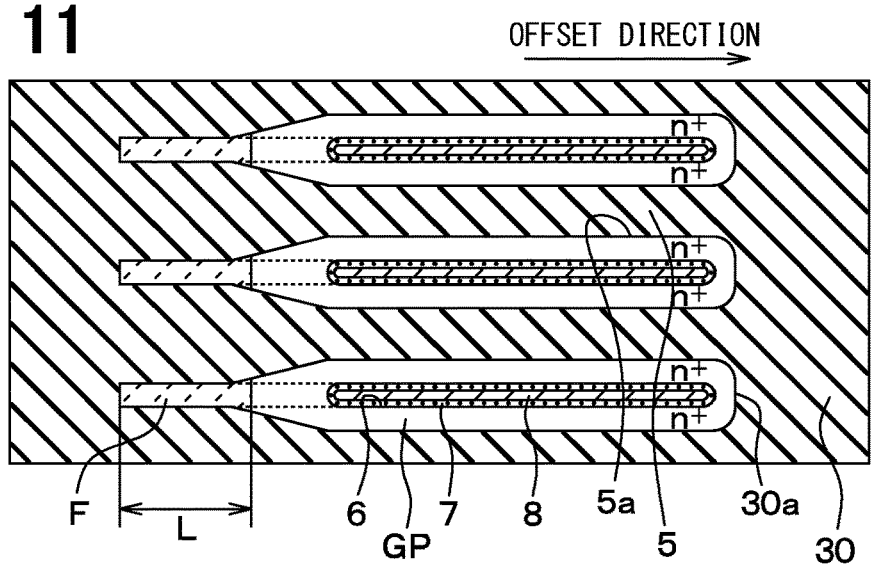
FIG. 11 is a partial enlarged view of the vicinity of a trench gate structure in the SiC semiconductor device according to the sixth embodiment.

As shown in FIG. 11, in the present embodiment, the facet side tip in the gate arrangement region GP is not made sharp although the width thereof is narrowed. Then, the side of the p type deep layer 30 opposite to the tip of the trench gate structure is left by the same width as the trench gate structure. More specifically, the width of the p type deep layer 5 is increased at the facet side tip so that the distance between the opposing p type deep layers 5 is equal to the width of the trench gate structure. Then, on the trench gate structure side, the width of the gate arrangement region GP is gradually expanded by gradually narrowing the width of the p type deep layer 5 from the facet side tip to the tip of the trench gate structure.

Thus, since the width of the gate arrangement region GP can be narrowed to the vicinity of the tip of the trench gate structure, it is possible to suppress the rise of the electric field and further to improve the withstand voltage of the SiC semiconductor device.

Other Embodiments

Although the present disclosure is made based on the embodiments described above, the present disclosure is not limited to such embodiments but includes various changes and modifications which are within equivalent ranges. In addition, while the various elements are shown in various combinations and configurations, which are exemplary, other combinations and configurations, including more, less or only a single element, are also within the spirit and scope of the present disclosure.

For example, in the above embodiment, the p type deep layer 30 is formed in the entire area of the connection portion. Alternatively, it is not necessary to form the p type deep layer 30 in the entire area. In addition, the p type deep layer 30 may be provided with at least a portion thereof connecting the adjacent p type deep layers 5. For example, the deep layer 30 may be in a stripe shape or in a plurality of concentric frame shapes disposed in the outer periphery of the cell portion.

Further, in the above embodiment, the longitudinal direction of the trench gate structure is the <11-20> direction. Alternatively, this direction is not necessarily required. That is, even when the longitudinal direction of the trench gate structure is a direction other than the <11-20> direction, the distance from the tip of the trench gate structure to the p type deep layer 30 may be longer than the facet length L. When the longitudinal direction of the trench gate structure is changed, the facet length L also changes accordingly, and the distance from the tip of the trench gate structure to the p type deep layer 30 may be set correspondingly.

In each of the above-described embodiments, a semiconductor substrate is described as an example to have a structure that the n− type drift layer 2 is formed on the surface of the n+ type substrate 1, the semiconductor substrate being an offset substrate having a high concentration impurity layer on the back side and a drift layer having an impurity concentration lower than that on the front side. However, this is merely an example of a semiconductor substrate. For example, a semiconductor substrate may be a structure in which a back surface layer is formed by ion-implanting n type dopant on the back surface side of the substrate providing the n− type drift layer 2, or formed by an epitaxial growth.

Figure 12:
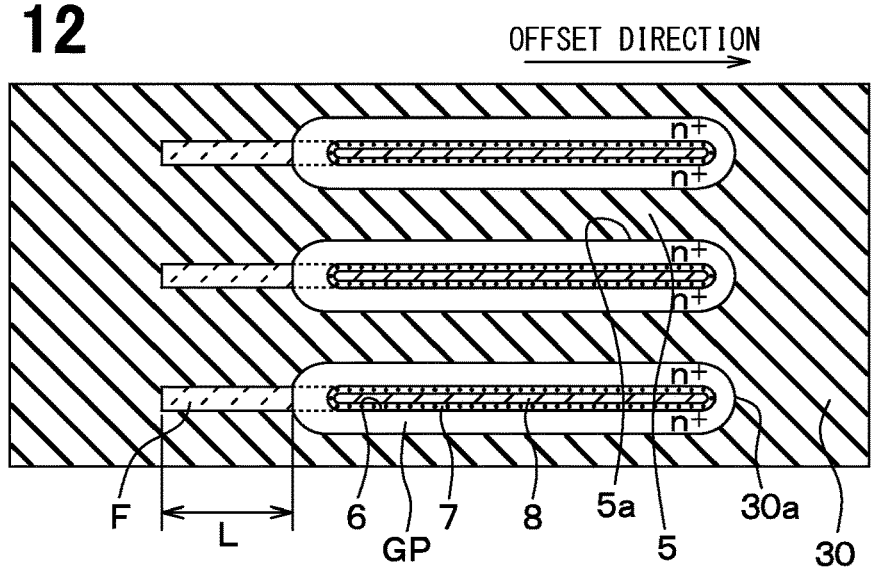
FIG. 12 is a partial enlarged view of the vicinity of a trench gate structure in the SiC semiconductor device described in another embodiment.

In the fourth to sixth embodiments, an example is shown in which the width of the end of the gate arrangement region GP on the side where the facet F is formed is narrower than the position where the trench gate structure is arranged. These are also merely examples, and may have other layouts. For example, as shown in FIG. 12, a region at the facet side tip having a narrow width may remain, and both sides of the p type deep layer 30 corresponding to both tips of the trench gate structure may be rounded, preferably rounded to be a semicircular shape.

Further, in the first to sixth embodiments, an n channel type MOSFET in which the first conductivity type is n type and the second conductivity type is p type has been described as an example. Alternatively, the conductivity type of each element may be reversed so as to form a p channel type MOSFET. Moreover, a MOSFET is described as an example and demonstrated as a device of a trench gate structure. Alternatively, the present disclosure may be applicable also to IGBT having a similar structure. In the IGBT, only the conductivity type of the n+ type substrate 1 is changed from the n type to the p type with respect to each of the above embodiments, and other structures and manufacturing methods are similar to those of the above embodiments.

It should be noted that, when the orientation of the crystal is to be indicated, a bar (−) should originally be attached above the desired number, but since there are restrictions on the expression based on the electronic application filing, the bar is attached before the desired number in this specification.

What is claimed is:
1. A silicon carbide semiconductor device comprising:
a vertical semiconductor element, which includes:
a semiconductor substrate made of silicon carbide and having a high impurity concentration layer with a first conductive type on a back side of the substrate and a drift layer having the first conductive type with a lower impurity concentration than the high impurity concentration layer on a front side of the substrate;
a base region made of silicon carbide with a second conductive type and arranged on the drift layer;
a source region arranged on the base region, made of silicon carbide, and having the first conductive type with a higher impurity concentration than the drift layer;
a deep layer having the second conductive type with a higher impurity concentration and disposed deeper than the base region;
a trench gate structure extending in a longitudinal direction and including a gate insulation film arranged on an inner wall of a gate trench and disposed in the gate trench which is arranged deeper than the base region from a surface of the source region and shallower than the deep layer, and a gate electrode disposed on the gate insulation film;
a source electrode electrically connected to the base region, the source region, and the deep layer; and
a drain electrode electrically connected to the high impurity concentration layer, wherein:
the deep layer includes a stripe shape portion arranged on each side of the trench gate structure and disposed along the longitudinal direction of the trench gate structure, and a tip opposing portion arranged to face each end of the trench gate structure;
a recess is disposed in the drift layer;
the base region is arranged on the drift layer and in the recess;
a facet is disposed in the base region toward one end of both ends of the trench gate structure from the tip opposing portion which faces the one end of the trench gate structure;
a length of the facet in a direction from the tip opposing portion toward the one of both ends of the trench gate structure is defined as a facet length;
a distance between the tip opposing portion and the one of both ends of the trench gate structure is longer than the facet length;
the semiconductor substrate is an offset substrate having an offset angle;
a film thickness of the base region and the source region is defined as t;
a depth of the recess is defined as d;
the offset angle is defined as $\theta$;
the facet length is defined as L; and
the facet length is represented by $L=(t-d)/\tan\theta$.

2. The silicon carbide semiconductor device according to claim 1, wherein:
the recess is disposed in the drift layer at a position corresponding to the deep layer;
the deep layer is disposed from a bottom of the recess; and
the base region is made of an epitaxial film arranged on the drift layer and in the recess.

3. The silicon carbide semiconductor device according to claim 1, wherein:
a region where the trench gate structure surrounded by the deep layer is disposed is defined as a gate arrangement region as viewed in a normal direction with respect to a surface of the semiconductor substrate; and
an end of the gate arrangement region on which the facet is disposed has a narrower width than a position where the trench gate structure is arranged.

4. The silicon carbide semiconductor device according to claim 3, wherein:
the end of the gate arrangement region on which the facet is disposed has the width gradually narrowed toward a tip of the gate arrangement region.

5. The silicon carbide semiconductor device according to claim 4, wherein:
the end of the gate arrangement region on which the facet is disposed has a sharp shape with an acute angle.

6. The silicon carbide semiconductor device according to claim 3, wherein:
a width of the end of the gate arrangement region on which the facet is disposed is equal to or greater than a width of the trench gate structure.

7. The silicon carbide semiconductor device according to claim 1, wherein:
the facet is a crystal plane.

8. The silicon carbide semiconductor device according to claim 1, wherein:
the facet is arranged on an epitaxial growth surface of the offset substrate.

9. The silicon carbide semiconductor device according to claim 1, wherein:
the facet is only formed at a position corresponding to the one end of the both ends of the trench gate structure, and not formed at a position corresponding to an other end of the both ends of the trench gate structure.

* * * * *